United States Patent
Toyomasu et al.

(10) Patent No.: US 10,926,301 B2
(45) Date of Patent: *Feb. 23, 2021

(54) LIQUID SUPPLYING DEVICE AND LIQUID SUPPLYING METHOD

(71) Applicant: Ebara Corporation, Tokyo (JP)

(72) Inventors: Fujihiko Toyomasu, Tokyo (JP); Junji Kunisawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 5 days.

This patent is subject to a terminal disclaimer.

(21) Appl. No.: 16/419,525

(22) Filed: May 22, 2019

(65) Prior Publication Data
US 2019/0270125 A1  Sep. 5, 2019

Related U.S. Application Data

(63) Continuation of application No. 15/942,734, filed on Apr. 2, 2018, now Pat. No. 10,343,192.

(30) Foreign Application Priority Data

Apr. 3, 2017 (JP) .............................. JP2017-073791

(51) Int. Cl.
*F16K 37/00* (2006.01)
*G05D 11/13* (2006.01)
(Continued)

(52) U.S. Cl.
CPC ................ *B08B 3/08* (2013.01); *B24B 37/00* (2013.01); *F16K 37/0091* (2013.01);
(Continued)

(58) Field of Classification Search
CPC ........... Y10T 137/271; Y10T 137/0324; Y10T 137/0352; Y10T 137/7759;
(Continued)

(56) References Cited

U.S. PATENT DOCUMENTS 5,331,364 A    7/1994  Borden
5,950,645 A  ‡  9/1999  Olesen ..................... B08B 3/12
                                                       134/100.1
(Continued)

FOREIGN PATENT DOCUMENTS

JP    2001-135604 A    5/2001
JP    2004-111668 A    4/2004
(Continued)

*Primary Examiner* — Matthew W Jellett
(74) *Attorney, Agent, or Firm* — Leydig, Voit and Mayer, Ltd.

(57) ABSTRACT

The present invention provides a liquid supplying device that can determine whether a CLC can be used appropriately. A liquid supplying device for supplying a liquid from a liquid source to a cleaning device is provided. The liquid supplying device includes a flow rate control device that measures a flow rate of a liquid from the liquid source and controls the flow rate based on the measured value, an IN-side pressure gauge provided between the liquid source and the flow rate control device and an OUT-side pressure gauge provided between the flow rate control device and the cleaning device.

7 Claims, 4 Drawing Sheets

(51) Int. Cl.
*B08B 3/08* (2006.01)
*G05D 7/06* (2006.01)
*H01L 21/67* (2006.01)
*B24B 37/00* (2012.01)

(52) U.S. Cl.
CPC ......... *G05D 7/0635* (2013.01); *G05D 11/132* (2013.01); *H01L 21/6704* (2013.01); *H01L 21/67017* (2013.01); *H01L 21/67051* (2013.01); *H01L 21/67253* (2013.01); *F15B 2211/50554* (2013.01); *F15B 2211/57* (2013.01); *Y10T 137/7759* (2015.04); *Y10T 137/7761* (2015.04)

(58) Field of Classification Search
CPC ......... Y10T 137/7761; Y10T 137/2705; F16K 37/0091; F15B 2211/57; F15B 2211/50554; B24B 57/02; G05D 7/0617; G05D 7/0623; G05D 7/0635
USPC ............. 137/87.04, 87.05, 87.06, 486, 487.5
See application file for complete search history.

(56) References Cited

U.S. PATENT DOCUMENTS

| | | | | |
|---|---|---|---|---|
| 6,152,162 | A | ‡ 11/2000 | Balazy | G05D 7/0635 137/110 |
| 6,280,300 | B1 | ‡ 8/2001 | Komatsu | B01D 35/12 451/87 |
| 6,802,333 | B2 | ‡ 10/2004 | Balazy | G05D 7/0635 137/110 |
| 6,802,762 | B2 | ‡ 10/2004 | Tanaka | B24B 57/02 451/28 |
| 7,216,656 | B2 | 5/2007 | Yamamoto | |
| 7,849,505 | B2 | 12/2010 | Satterlee et al. | |
| 8,590,561 | B2 | ‡ 11/2013 | Igarashi | G01F 1/42 137/487 |
| 8,714,188 | B2 | ‡ 5/2014 | Ohmi | F16K 47/02 137/487.5 |
| 9,110,474 | B2 | ‡ 8/2015 | Skoglund | G01F 1/363 |
| 9,870,006 | B2 | ‡ 1/2018 | Hirata | G01F 25/0007 |
| 2003/0094196 | A1* | 5/2003 | Siefering | H01L 21/67086 137/93 |
| 2004/0045592 | A1 | ‡ 3/2004 | Yamamoto | B08B 3/02 134/157 |
| 2009/0145463 | A1 | 6/2009 | Oh et al. | |
| 2014/0216505 | A1 | 8/2014 | Toyomasu et al. | |
| 2015/0357208 | A1 | 12/2015 | Toyomasu et al. | |
| 2018/0056470 | A1 | ‡ 3/2018 | Imai | B24B 5/35 |

FOREIGN PATENT DOCUMENTS

| | | | | |
|---|---|---|---|---|
| JP | 2007-141926 | A | 6/2007 | |
| JP | 2008-078322 | A | 4/2008 | |
| JP | 2008078322 | A ‡ | 4/2008 | ......... H01L 21/304 |
| JP | 2009-054959 | A | 3/2009 | |
| JP | 2009-141332 | A | 6/2009 | |
| JP | 2009-172459 | A | 8/2009 | |
| JP | 2011-066235 | A | 3/2011 | |
| JP | 2012-099730 | A | 5/2012 | |
| JP | 2016-015469 | A | 1/2016 | |

\* cited by examiner
‡ imported from a related application

LIQUID SUPPLYING DEVICE AND LIQUID SUPPLYING METHOD

CROSS-REFERENCE TO RELATED APPLICATION

The present application is a continuation of U.S. patent application No. 15/942,743, filed on Apr. 2,2018, which is based upon and claims benefit of priority from Japanese Patent Application No. 2017-073791 filed on Apr. 3, 2017, the entire contents of which are incorporated herein by reference.

TECHNICAL FIELD

The present invention relates to a liquid supplying device and a liquid supplying method.

BACKGROUND ART

A CMP (chemical mechanical polishing) device includes a polishing device for polishing a surface of a semiconductor substrate on which a semiconductor chip is formed and a cleaning device for cleaning the semiconductor substrate polished by the polishing device while supplying a cleaning chemical. This cleaning device creates a cleaning chemical (diluted chemical) by a chemical with mixing dilution water such as DIW (De-Ionized Water) and cleans the semiconductor substrate by using the cleaning chemical (see, for example, Japanese Patent Laid-Open No. 2009-54959).

Cleaning devices using a cleaning chemical conventionally use a CLC (closed loop controller) that measures a flow rate of a liquid and controls the flow rate based on the measured value. The CLC can control flow rates of the chemical and DIW and supply the chemical which is diluted at a predetermined ratio to the cleaning device.

As a flowmeter provided inside the CLC, a differential pressure type flowmeter (orifice flowmeter) is generally used. With an orifice placed in a path through which a fluid passes, the differential pressure type flowmeter measures a volume flow rate (flow speed) of the fluid based on the differential pressure. A measurement range of the differential pressure type flowmeter, that is, a flow rate range that can be controlled by the CLC structurally falls within a range predetermined according to a diameter of the orifice, for example, from 30 ml/min to 300 ml/min. For example, in the case of the CLC provided with an ultrasonic type flowmeter, its controllable flow rate range is defined to be a predetermined range.

In the conventional cleaning chemical supplying device, when a dilution ratio of the cleaning chemical is changed in association with a change in a process recipe or the like or when a flow rate of the cleaning chemical supplied is changed, the flow rates of the required chemical and the DIW may deviate from the flow rate range that can be controlled by the currently selected CLC. In that case, the change in the process recipe is handled by replacing the CLC by a CLC having a controllable flow rate range.

SUMMARY OF INVENTION

Technical Problem

The flow rate range that can be controlled by the CLC becomes the range defined as described above. However, the flow rate that can be actually supplied by the CLC to the cleaning device varies depending on a differential pressure between an IN-side pressure and an OUT-side pressure of the CLC. That is, the above-described controllable flow rate range of the CLC is a maximum flow rate range when the differential pressure is sufficiently large, and when the differential pressure is insufficient, only a flow rate that is less than the maximum flow rate can be supplied to the cleaning device.

When the CLC is changed in association with a change in the process recipe or the like, the conventional cleaning chemical supplying device selects the CLC based on the controllable flow rate range. When the differential pressure between an IN-side pressure and an OUT-side pressure of the CLC is sufficiently large, the selected CLC can supply a cleaning chemical at a desired flow rate to the cleaning device. However, when the differential pressure is insufficient as described above, even when a CLC having an appropriate flow rate range is selected, a cleaning chemical at a desired flow rate cannot be supplied to the cleaning device. One cause that the CLC cannot supply a desired flow rate can be a malfunction of the CLC. For this reason, when a desired flow rate cannot be supplied, it is not possible to determine whether the CLC malfunctions or the differential pressure is insufficient.

The present invention has been implemented in view of the above-described problems, and it is one of objects of the present invention to provide a liquid supplying device capable of determining whether the CLC can be appropriately used or not.

Solution to Problem

According to an aspect of the present invention, a liquid supplying device for supplying a liquid from a liquid source to a cleaning device is provided. This liquid supplying device includes a flow rate control device that measures a flow rate of the liquid from the liquid source and controls the flow rate based on the measured value, an IN-side pressure gauge provided between the liquid source and the flow rate control device and an OUT-side pressure gauge provided between the flow rate control device and the cleaning device.

According to another aspect of the present invention, a liquid supplying method is provided for a liquid supplying device provided with a flow rate control device that measures a flow rate from a liquid source and controls the flow rate based on the measured value, to supply a liquid from the liquid source to a cleaning device. The liquid supplying method includes a flow rate controlling step of measuring a flow rate from the liquid source and controlling the flow rate based on the measured value, a first measuring step of measuring a pressure of a liquid flowing into the flow rate control device and a second measuring step of measuring a pressure of a liquid flowing out from the flow rate control device.

DESCRIPTION OF EMBODIMENTS

Figure 1:
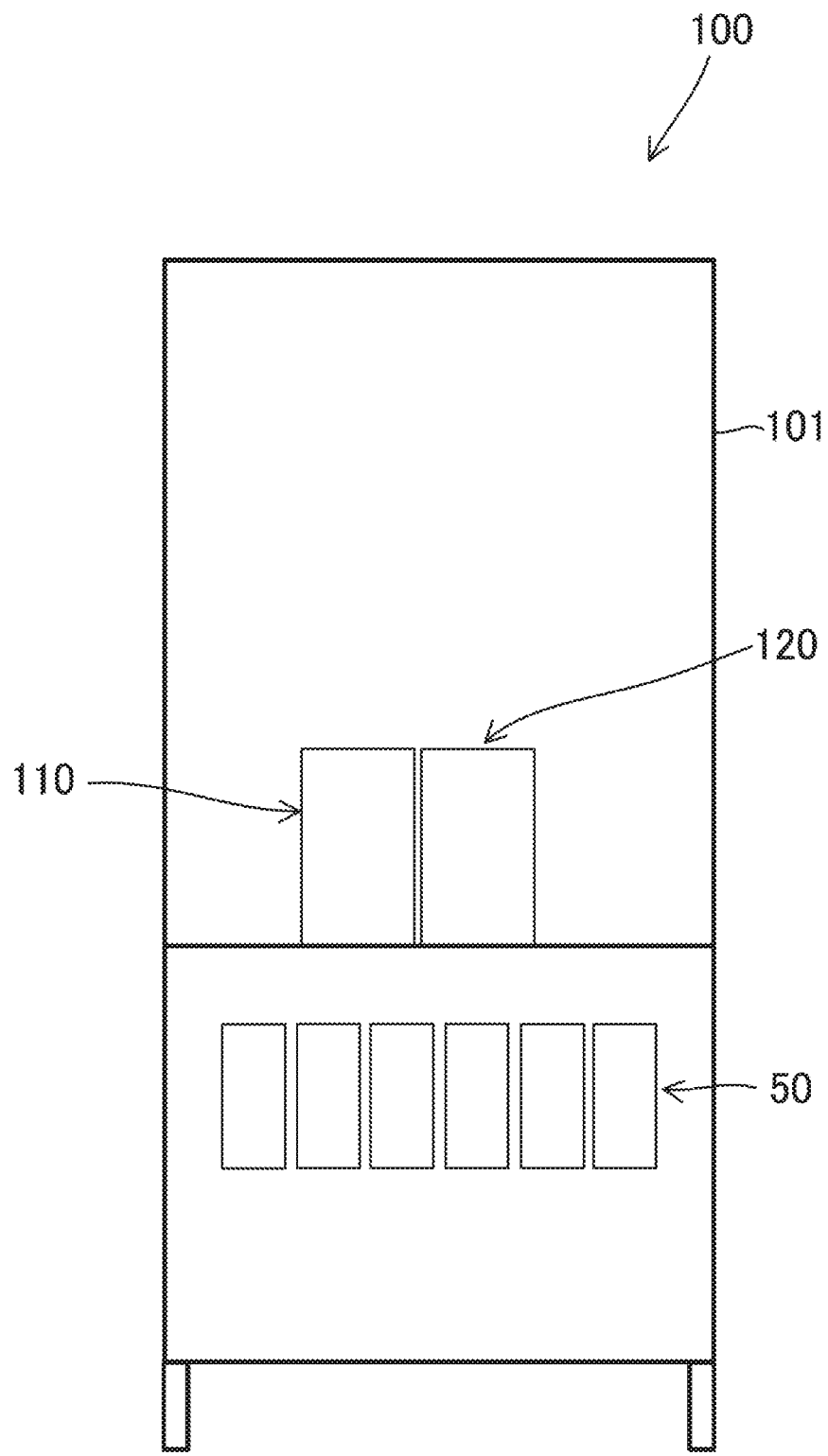
FIG. 1 is a schematic front view illustrating a chemical supplying device according to a first embodiment.

Hereinafter, embodiments of the present invention will be described with reference to the accompanying drawings. In the drawings described hereinafter, identical or equivalent components are assigned identical reference numerals and duplicate description is omitted. Although a chemical cleaning device will be described hereinafter as an example of a liquid supplying device, without being limited to this, the present invention includes any liquid supplying device that can supply a liquid to a cleaning device.

First Embodiment

FIG. 1 is a schematic front view illustrating a chemical supplying device according to a first embodiment. The chemical supplying device according to the present embodiment is configured to be able to supply an acid or alkaline first chemical to a cleaning device. As shown in FIG. 1, the chemical supplying device 100 includes a housing 101, a DIWCLC box 110 and a first chemical CLC box 120. The DIWCLC box 110 controls a supply of DIW (corresponding to an example of dilution water). The first chemical CLC box 120 controls a supply of a first chemical.

The chemical supplying device 100 is further provided with chemical utility boxes 50 for introducing the first chemical from a first chemical supply source 20 (see FIG. 2) to the chemical supplying device 100. In the example shown in the drawing, the chemical supplying device 100 is provided with six chemical utility boxes 50, but these are merely examples and the number of the chemical utility boxes 50 is changed as appropriate depending on a specification of the cleaning device.

The DIWCLC box 110, the first chemical CLC box 120 and the chemical utility boxes 50 are housed in the housing 101. The DIWCLC box 110 is configured to supply DIW from a DIW supply source 10 which will be described later to a first in-line mixer 72 which will be described later (see FIG. 2). Furthermore, the DIWCLC box 110 can control the flow rate of DIW to a flow rate set through feedback control.

The first chemical CLC box 120 is configured to supply the first chemical from the first chemical supply source 20 to the first in-line mixer 72 which will be described later (see FIG. 2). Furthermore, the first chemical CLC box 120 can control a flow rate of the first chemical to the flow rate set through feedback control. The chemical supplying device 100 includes a pipe for transporting the DIW or the first chemical, a valve and a pressure gauge or the like, which are not shown. Details thereof will be described in FIG. 2.

Figure 2:
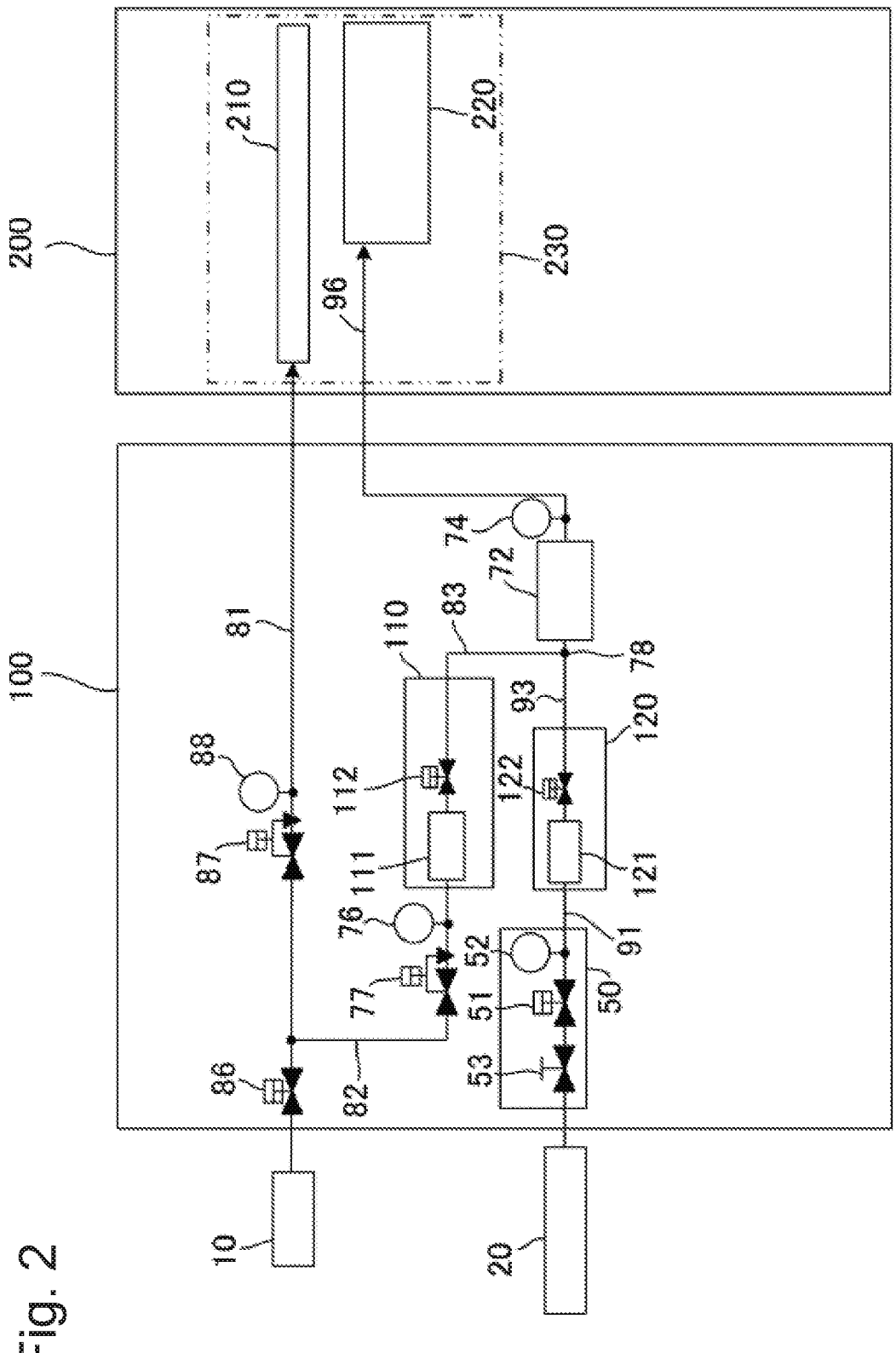
FIG. 2 is a diagram illustrating a chemical supply flow of the chemical supplying device according to the first embodiment.

FIG. 2 is a diagram illustrating a chemical supply flow of the chemical supplying device 100 according to the first embodiment. As shown in FIG. 2, the chemical supplying device 100 is configured to be in fluid communication with the DIW supply source 10 (corresponding to an example of the dilution water supply source) for supplying the DIW and the first chemical supply source 20 for supplying the first chemical via their respective pipes. The chemical supplying device 100 is also configured to be in fluid communication with a cleaning device 200. More specifically, the chemical supplying device 100 supplies DIW and the diluted first chemical (first cleaning chemical) to the cleaning device 200.

The cleaning device 200 includes a DIW cleaning section 210 that cleans a cleaning target such as a semiconductor substrate polished by a polishing device using DIW and a chemical cleaning section 220 that cleans a cleaning target such as a semiconductor substrate polished by a polishing device using a diluted first chemical (first cleaning chemical). The DIW cleaning section 210 is constructed of, for example, an ultrasonic water cleaning section or other DIW cleaning sections. The chemical cleaning section 220 is constructed of, for example, a roll type cleaning section. The DIW cleaning section 210 and the chemical cleaning section 220 coexist in a same cleaning tank 230.

The chemical supplying device 100 is provided with the first in-line mixer 72, the first chemical CLC box 120 and the DIWCLC box 110. The first in-line mixer 72 mixes the first chemical and the DIW to generate a first cleaning chemical. The first chemical CLC box 120 controls the flow rate of the first chemical supplied from the first chemical supply source 20 to the first in-line mixer 72. The DIWCLC box 110 controls the flow rate of the DIW supplied from the DIW supply source 10 to the first in-line mixer 72.

The DIWCLC box 110 includes a first DIW supply valve 112 and a CLC 111 (corresponding to an example of the dilution water flow rate control device). The first DIW supply valve 112 switches ON/OFF of DIW supply from the CLC 111 to the first in-line mixer 72. The CLC 111 measures a flow rate of DIW supplied to the first in-line mixer 72 and controls the flow rate based on the measured value. More specifically, the CLC 111 adjusts (performs feedback control) opening of a control valve inside the CLC 111 based on the measured flow rate of DIW so that the flow rate of DIW flowing into the CLC 111 becomes a desired flow rate. The DIWCLC box 110 supplies the DIW to the first in-line mixer 72 by opening the first DIW supply valve 112.

The first chemical CLC box 120 includes a first chemical supply valve 122 and a CLC 121 (corresponding to an example of the chemical flow rate control device). The first chemical supply valve 122 switches ON/OFF of first chemical supply from the CLC 121 to the first in-line mixer 72. The CLC 121 measures a flow rate of the first chemical supplied to the first in-line mixer 72 via the first chemical supply valve 122 and controls the flow rate based on the measured value. More specifically, the CLC 121 adjusts (performs feedback control) opening of the control valve inside the CLC 121 based on the measured flow rate of the first chemical so that the flow rate of the first chemical flowing into the CLC 121 becomes a desired flow rate.

The chemical supplying device 100 is provided with the chemical utility boxes 50. The chemical utility boxes 50 introduce the first chemical from the first chemical supply source 20 to the CLC 121 of the first chemical CLC box 120. The chemical utility boxes 50 are provided on a pipe 91 connecting the first chemical supply source 20 and the CLC 121 of the first chemical CLC box 120. Each chemical utility box 50 is provided with a manual valve 53, a first chemical inlet valve 51 that switches ON/OFF of first chemical supply to the CLC 121 and a pressure gauge 52 (corresponding to an example of the chemical IN-side pressure gauge) that measures a fluid pressure in the pipe 91. Opening/closing of the first chemical inlet valve 51 is controlled by, for example, a control device (not shown). Since the pipe 91 is connected to the CLC 121 of the first chemical CLC box 120, the pressure gauge 52 is configured to measure a pressure of the IN-side (primary side) of the CLC 121. In other words, the pressure gauge 52 measures a pressure of the first chemical flowing into the CLC 121.

The chemical supplying device 100 is provided with a DIW supply pipe 81, one end of which is connected to the DIW supply source 10 and the other end of which is connected to the DIW cleaning section 210 of the cleaning device 200. The DIW supply pipe 81 is provided with a DIW supply valve 86, a DIW pressure adjusting regulator 87 and a DIW pressure gauge 88. By being opened/closed, the DIW supply valve 86 controls a supply of the DIW from the DIW supply source 10 to the DIW supply pipe 81. The DIW pressure adjusting regulator 87 adjusts a supply pressure of the DIW from the DIW supply pipe 81 to the DIW cleaning section 210. The DIW pressure gauge 88 measures the pressure of the DIW passing through an interior of the DIW supply pipe 81.

One end of a DIW branch pipe 82 is connected between the DIW supply valve 86 and the DIW pressure adjusting regulator 87 on the DIW supply pipe 81. The other end of the DIW branch pipe 82 is connected to the CLC 111 of the DIWCLC box 110. A DIW pressure adjusting regulator 77 and a pressure gauge 76 are provided on the DIW branch pipe 82. One end of a first DIW pipe 83 is connected to the CLC 111. The other end of the first DIW pipe 83 is connected to a first chemical pipe 93 which will be described later at a confluence part 78 and is in fluid communication with the first in-line mixer 72. Note that as shown in FIG. 2, the confluence part 78 is a point of confluence where the DIW from the CLC 111 and the first chemical from the CLC 121 joint together. The first DIW supply valve 112 is provided on the first DIW pipe 83 and opening/closing thereof is controlled when the DIW is supplied to the first in-line mixer 72.

In the chemical supplying device 100 according to the present embodiment, a pressure gauge 76 (corresponding to an example of a dilution water IN-side pressure gauge) is provided on the IN-side of the CLC 111. More specifically, the pressure gauge 76 is provided between the DIW pressure adjusting regulator 77 and the CLC 111 in the example in FIG. 2. This pressure gauge 76 measures a pressure of the DIW flowing into the CLC 111.

A first chemical pipe 93 in fluid communication with the first in-line mixer 72 is connected to the CLC 121 of the first chemical CLC box 120. The first chemical supply valve 122 is provided on the first chemical pipe 93 and opening/closing thereof is controlled when the first chemical is supplied to the first in-line mixer 72. A first cleaning chemical pipe 96, one end of which is connected to the chemical cleaning section 220 is connected to the first in-line mixer 72. A pressure gauge 74 (corresponding to an example of the OUT-side pressure gauge) is provided on the OUT-side (secondary side) of the first in-line mixer 72. Since the DIW from the CLC 111 of the DIWCLC box 110 and the first chemical from the CLC 121 of the first chemical CLC box 120 join together at the confluence part 78, the pressure on the OUT-side (secondary side) of the CLC 111 is equal to the pressure on the OUT-side of the CLC 121. Therefore, this pressure gauge 74 can measure pressures on the OUT-side of the CLC 111 and the CLC 121. In other words, the pressure gauge 74 measures pressures of liquids flowing out from the CLC 111 and the CLC 121.

The CLC 111 of the DIWCLC box 110 and the CLC 121 of the first chemical CLC box 120 are configured to be able to receive signals indicating predetermined flow rate values from a control device (not shown). Openings of inner control valves of the CLC 111 and the CLC 121 are controlled based on the flow rate values.

Next, a chemical supply process in which the chemical supplying device 100 shown in FIG. 2 supplies the first cleaning chemical to the chemical cleaning section 220 will be described. When the first cleaning chemical is supplied to the chemical cleaning section 220, the first chemical inlet valve 51 of the chemical utility box 50 is opened first and the manual valve 53 is then opened. The CLC 121 of the first chemical CLC box 120 measures the flow rate of the first chemical and controls the flow rate based on the measured value. The first chemical at a predetermined flow rate is supplied to the first in-line mixer 72 from the first chemical supply source 20 via the CLC 121 and the confluence part 78.

When the DIW supply valve 86 on the DIW supply pipe 81 is opened, the DIW is supplied from the DIW supply source 10 to the CLC 111 of the DIWCLC box 110. The CLC 111 measures the flow rate of the DIW and controls the flow rate based on this measured value. When the first DIW supply valve 112 is opened, the DIW is supplied from the DIWCLC box 110 to the first in-line mixer 72 via the confluence part 78. The first chemical and the DIW are mixed at the first in-line mixer 72. The first cleaning chemical generated in this way is supplied to the chemical cleaning section 220 via the first cleaning chemical pipe 96.

When the first cleaning chemical is supplied to the chemical cleaning section 220, the pressure gauge 76, the pressure gauge 52 and the pressure gauge 74 measure a pressure on the IN-side of the CLC 111, a pressure on the IN-side of the CLC 121 and pressures on the OUT-side of the CLC 111 and the CLC 121 respectively. It is thereby possible to obtain a differential pressure between the IN-side pressure and the OUT-side pressure of the CLC 111 and a differential pressure between the IN-side pressure and the OUT-side pressure of the CLC 121.

As described above, flow rate ranges that can be controlled by the CLCs 111 and 121 are determined based on the structure of the flowmeter provided inside. However, the flow rate of the liquid that can be actually supplied to the cleaning device 200 from the CLC 111 or 121 varies depending on a differential pressure between the IN-side pressure and the OUT-side pressure of the CLC 111 or 121. That is, the flow rate range that can be controlled by the CLC 111 or 121 is a maximum flow rate range when the differential pressure is sufficiently large, and when the differential pressure is insufficient, only a flow rate smaller than the maximum flow rate can be supplied to the cleaning device 200.

When the CLC is changed in association with a change in the process recipe, the conventional chemical supplying device selects a CLC based on the controllable flow rate range. Therefore, when the differential pressure between the IN-side pressure and the OUT-side pressure of the CLC is sufficiently large, the selected CLC can supply a cleaning chemical at a desired flow rate to the cleaning device. However, as described above, when the differential pressure is insufficient, even when a CLC having an appropriate flow rate range is selected, it is not possible to supply the cleaning chemical at the desired flow rate to the cleaning device. One cause that the CLC cannot supply a desired flow rate may be attributable to a malfunction of the CLC. For this reason, when the desired flow rate cannot be supplied, it is not possible to determine whether the CLC is malfunctioning or the differential pressure is insufficient.

In contrast, in the present embodiment, it is possible to obtain a differential pressure between the IN-side pressure and the OUT-side pressure of the CLC 111 and a differential pressure between the IN-side pressure and the OUT-side pressure of the CLC 121 as shown in FIG. 2. In this way, even if the CLC 111 or the CLC 121 cannot supply a desired flow rate, the operator can grasp whether the CLC 111 or the CLC 121 is malfunctioning or the differential pressure is insufficient by monitoring the differential pressure.

By acquiring the differential pressure between the IN-side pressure and the OUT-side pressure of the CLC 111 and the differential pressure between the IN-side pressure and the OUT-side pressure of the CLC 121, it is possible to easily select an appropriate CLC when changing the CLC 111 or the CLC 121 in association with a change in the process recipe. More specifically, a CLC may be selected which can supply a desired flow with a differential pressure achieved at the present time among various CLCs having different controllable flow rate ranges. Note that the CLC has a relationship between a differential pressure and a controllable flow rate range as a feature thereof and the relationship is acquired in advance.

The pressure gauge 74 in the present embodiment is provided on the secondary side of the first in-line mixer 72, but without being limited to this, the pressure gauge 74 may be provided at any place if it is possible to measure a pressure on the OUT-side of the CLC 111 or the CLC 121. For example, the pressure gauge 74 can be provided on the OUT-side of the DIWCLC box 110 or on the OUT-side of the first chemical CLC box 120 or the like.

Second Embodiment

Figure 3:
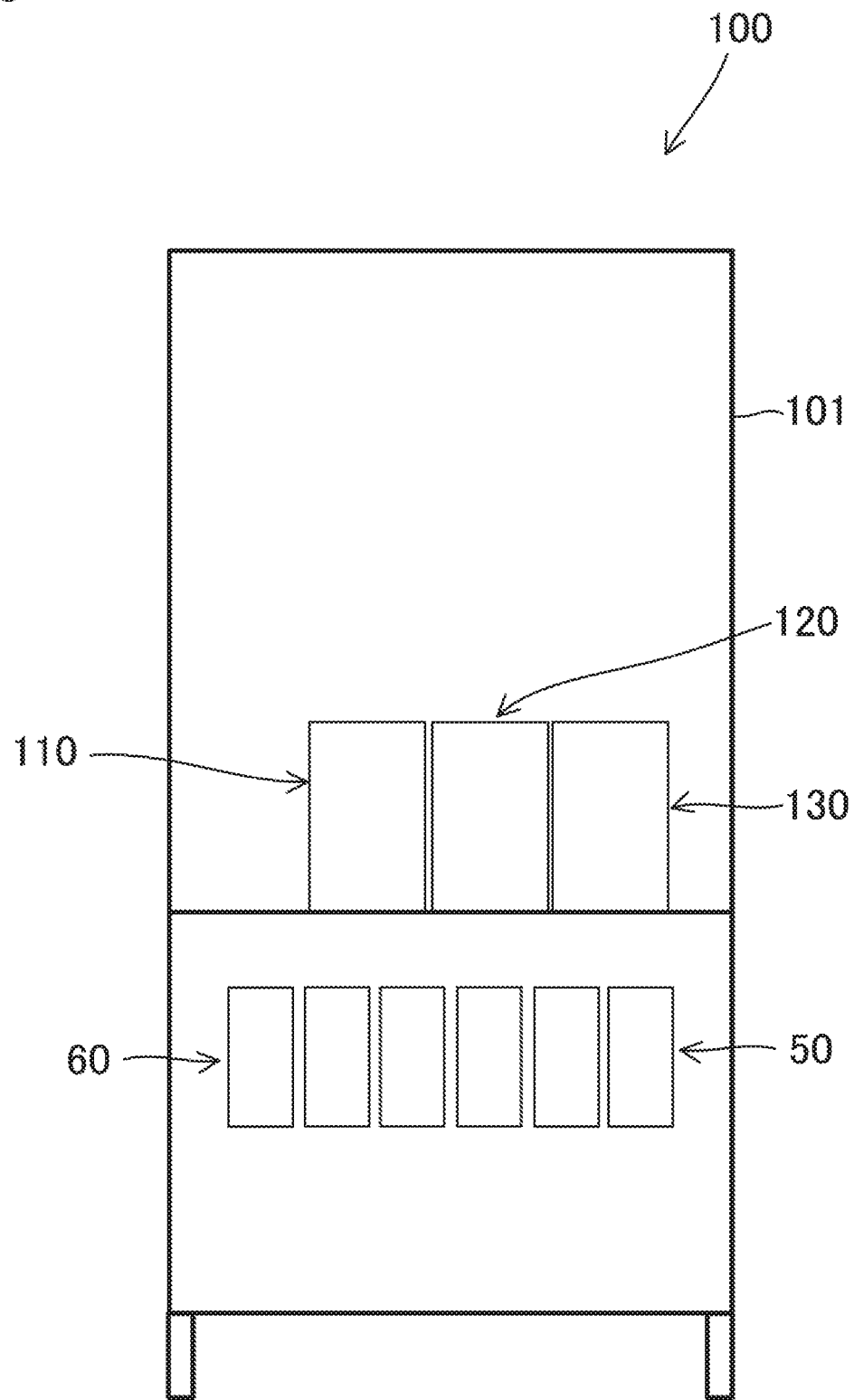
FIG. 3 is a schematic front view illustrating a chemical supplying device according to a second embodiment.

FIG. 3 is a schematic front view illustrating a chemical supplying device according to a second embodiment. The chemical supplying device according to the present embodiment is different from the chemical supplying device shown in the first embodiment in that it uses two kinds of chemicals. That is, the chemical supplying device is configured to be able to supply a first chemical which is, for example, an alkaline chemical and a second chemical which is, for example, an acid chemical to a cleaning device. Therefore, the chemical supplying device 100 according to the second embodiment includes a second chemical CLC box 130 in addition to the configuration of the chemical supplying device 100 shown in FIG. 1. The second chemical CLC box 130 controls a supply of the second chemical. The chemical supplying device 100 is also provided with chemical utility boxes 60 for introducing the second chemical from a second chemical supply source 30 (see FIG. 4) to the chemical supplying device 100.

Figure 4:
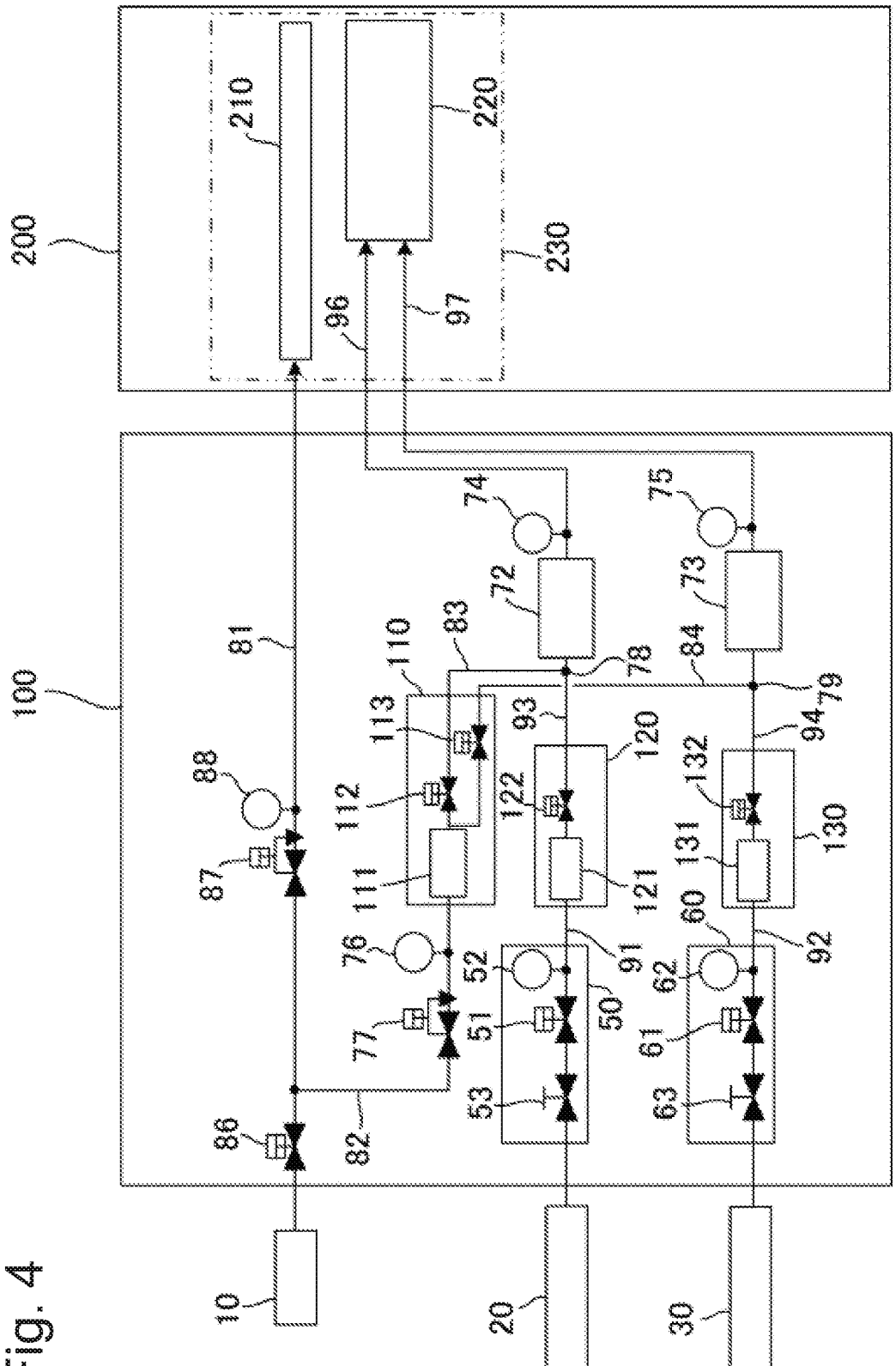
FIG. 4 is a diagram illustrating a chemical supply flow of the chemical supplying device according to the second embodiment.

FIG. 4 is a diagram illustrating a chemical supply flow of the chemical supplying device 100 according to the second embodiment. As shown in FIG. 4, the chemical supplying device 100 according to the second embodiment is provided with a mechanism for supplying a second chemical in addition to the configuration of the chemical supplying device 100 according to the first embodiment. More specifically, the chemical supplying device 100 according to the second embodiment is configured to be in fluid communication with the second chemical supply source 30 for supplying the second chemical via a pipe and supply a diluted second chemical (second cleaning chemical) to the cleaning device 200.

The chemical supplying device 100 is provided with a second in-line mixer 73 and a second chemical CLC box 130. The second in-line mixer 73 mixes the second chemical and DIW to generate a second cleaning chemical. The second chemical CLC box 130 controls a flow rate of the second chemical supplied from the second chemical supply source 30 to the second in-line mixer 73.

The DIWCLC box 110 includes a second DIW supply valve 113. The second DIW supply valve 113 switches ON/OFF of DIW supply from the CLC 111 to the second in-line mixer 73. The CLC 111 measures a flow rate of the DIW to be supplied to the first in-line mixer 72 or the second in-line mixer 73 and controls the flow rate based on this measured value.

The DIWCLC box 110 closes the second DIW supply valve 113 and opens the first DIW supply valve 112 to thereby supply the DIW to the first in-line mixer 72. On the other hand, the DIWCLC box 110 closes the first DIW supply valve 112 and opens the second DIW supply valve 113 to thereby supply the DIW to the second in-line mixer 73.

The second chemical CLC box 130 includes a second chemical supply valve 132 and a CLC 131 (corresponding to an example of the chemical flow rate control device). The second chemical supply valve 132 switches ON/OFF of second chemical supply from the CLC 131 to the second in-line mixer 73. The CLC 131 measures a flow rate of the second chemical to be supplied to the second in-line mixer 73 and controls the flow rate based on this measured value. More specifically, the CLC 131 adjusts (performs feedback control) opening of a control valve inside the CLC 131 based on the measured flow rate of the second chemical so that the flow rate of the second chemical flowing into the CLC 131 becomes a desired flow rate.

The chemical supplying device 100 is provided with a chemical utility box 60. The chemical utility box 60 introduces the second chemical from the second chemical supply source 30 to the CLC 131 of the second chemical CLC box 130. The chemical utility box 60 is provided on a pipe 92 that connects the second chemical supply source 30 and the CLC 131 of the second chemical CLC box 130. The chemical utility box 60 is provided with a manual valve 63, a second chemical inlet valve 61 that switches ON/OFF of second chemical supply to the CLC 131 and a pressure gauge 62 (corresponding to an example of the chemical IN-side pressure gauge) that measures a fluid pressure in the pipe 92. Opening/closing of the second chemical inlet valve 61 is controlled by, for example, a control device (not shown). Since the pipe 92 is connected to the CLC 131 of the second chemical CLC box 130, the pressure gauge 62 is configured to measure a pressure on the IN-side (primary side) of the CLC 131. In other words, the pressure gauge 62 measures a pressure of the second chemical flowing into the CLC 131.

A second DIW pipe 84 in fluid communication with the second in-line mixer 73 is connected to the CLC 111 of the DIWCLC box 110. One end of the second DIW pipe 84 is connected to the CLC 111. The other end of the second DIW pipe 84 is connected to a second chemical pipe 94 which will be described later, at a confluence part 79 and is in fluid communication with the second in-line mixer 73. Note that as shown in FIG. 4, the confluence part 79 is a point at which the DIW from the CLC 111 and the second chemical from the CLC 131 join together. The second DIW supply valve 113 is provided on the second DIW pipe 84 and opening/closing thereof is controlled when the DIW is supplied to the second in-line mixer 73.

The second chemical pipe 94 in fluid communication with the second in-line mixer 73 is connected to the CLC 131 of the second chemical CLC box 130. The second chemical supply valve 132 is provided on the second chemical pipe 94 and opening/closing thereof is controlled when the second chemical is supplied to the second in-line mixer 73. A second cleaning chemical pipe 97, one end of which is connected to the chemical cleaning section 220 is connected to the second in-line mixer 73. A pressure gauge 75 (corresponding to an example of the OUT-side pressure gauge) is provided on the OUT-side (secondary side) of the second in-line mixer 73. Since the DIW from the CLC 111 of the DIWCLC box 110 and the second chemical from the CLC 131 of the second chemical CLC box 130 join together at the confluence part 79, a pressure on the OUT-side (secondary side) of the CLC 111 is equal to a pressure on the OUT-side of the CLC 131. Therefore, this pressure gauge 75 can measure pressures on the OUT-side (secondary side) of the CLC 111 and the CLC 131. In other words, the pressure gauge 75 measures pressures of liquids flowing out from the CLC 111 and the CLC 131.

The CLC 131 of the second chemical CLC box 130 is configured to be able to receive a signal indicating a predetermined flow rate value from a control device (not shown). Opening of an inner control valve of the CLC 131 is controlled based on this flow rate value.

Next, a chemical supply process will be described in which the chemical supplying device 100 shown in FIG. 4 supplies the first cleaning chemical and the second cleaning chemical to the chemical cleaning section 220. When the first cleaning chemical is supplied to the chemical cleaning section 220 of the cleaning device 200, the first chemical inlet valve 51 of the chemical utility box 50 is opened first and the manual valve 53 is then opened. A flow rate of the first chemical is adjusted by the CLC 121 of the first chemical CLC box 120 and the first chemical at a predetermined flow rate is supplied from the first chemical supply source 20 to the first in-line mixer 72.

When the DIW supply valve 86 on the DIW supply pipe 81 is opened, the DIW is supplied from the DIW supply source 10 to the CLC 111 of the DIWCLC box 110. When the first DIW supply valve 112 is opened, the DIW is supplied from the DIWCLC box 110 to the first in-line mixer 72. At this time, the second DIW supply valve 113 should be closed.

The first chemical and DIW supplied to the first in-line mixer 72 are mixed. The first cleaning chemical generated in this way is supplied to the chemical cleaning section 220 via the first cleaning chemical pipe 96. While the first cleaning chemical is being supplied to the chemical cleaning section 220, the supply of the second chemical to the second in-line mixer 73 is stopped. More specifically, the second chemical supply valve 132 of the second chemical CLC box 130 is closed. Thus, the second cleaning chemical is not supplied, but only the first cleaning chemical is supplied to the chemical cleaning section 220.

While the first cleaning chemical is being supplied to the chemical cleaning section 220, the pressure gauge 76, the pressure gauge 52 and the pressure gauge 74 measure a pressure on the IN-side of the CLC 111, a pressure on the IN-side of the CLC 121 and pressures on the OUT-side of the CLC 111 and the CLC 121 respectively. It is thereby possible to obtain a differential pressure between the IN-side pressure and the OUT-side pressure of the CLC 111 and a differential pressure between the IN-side pressure and the OUT-side pressure of the CLC 121.

When the second cleaning chemical is supplied to the chemical cleaning section 220 of the cleaning device 200, the second chemical inlet valve 61 of the chemical utility box 60 is opened first and the manual valve 63 is then opened. The CLC 131 of the second chemical CLC box 130 adjusts the flow rate of the second chemical and the second chemical at a predetermined flow rate is supplied from the second chemical supply source 30 to the second in-line mixer 73.

When the DIW supply valve 86 on the DIW supply pipe 81 is opened, the DIW is supplied from the DIW supply source 10 to the CLC 111 of the DIWCLC box 110. When the second DIW supply valve 113 is opened, the DIW is supplied from the DIWCLC box 110 to the second in-line mixer 73. At this time, the first DIW supply valve 112 is closed.

The second chemical and the DIW are mixed at the second in-line mixer 73. The second cleaning chemical generated in this way is supplied to the chemical cleaning section 220 via the second cleaning chemical pipe 97. While the second cleaning chemical is being supplied to the chemical cleaning section 220, the supply of the first chemical to the first in-line mixer 72 is stopped. More specifically, the first chemical supply valve 122 of the first chemical CLC box 120 is closed. Thus, the first cleaning chemical is not supplied, but only the second cleaning chemical is supplied to the chemical cleaning section 220.

While the second cleaning chemical is being supplied to the chemical cleaning section 220, the pressure gauge 76, the pressure gauge 62, and the pressure gauge 75 measure a pressure on the IN-side of the CLC 111, a pressure on the IN-side of the CLC 131 and pressures on the OUT-side of the CLC 111 and the CLC 131 respectively. It is thereby possible to obtain a differential pressure between the IN-side pressure and the OUT-side pressure of the CLC 111 and a differential pressure between the IN-side pressure and the OUT-side pressure of the CLC 131.

As described above, the chemical supplying device 100 using a plurality of chemicals as in the case of the second embodiment can also obtain a differential pressure between the respective IN-side pressures and the OUT-side pressures of the CLCs 111, 121 and 131. Thus, the operator monitors the differential pressure between the respective IN-side pressures and the OUT-side pressures of the CLCs 111, 121 and 131, and can thereby grasp whether the CLCs 111, 121 and 131 are malfunctioning or a differential pressure is insufficient as in the case of the first embodiment. Furthermore, by acquiring the differential pressure between the IN-side pressures and the OUT-side pressures of the CLCs 111, 121 and 131 in advance, it is possible to easily select an appropriate CLC when changing any one of the CLCs 111, 121 and 131 in association with a change in the process recipe.

The embodiments of the present invention have been described so far, but the aforementioned embodiments are intended to make an understanding of the present invention easier and not to limit the present invention. The present invention may be changed or modified without departing from the spirit and scope of the present invention and it goes without saying that the present invention includes equivalents thereof. It is possible to arbitrarily combine or omit the components described in the scope of claims and the specification within a scope that exerts at least part of the scope or effects within which at least some of the aforementioned problems can be solved.

Hereinafter, some of aspects disclosed in the present specification will be described.

According to a first aspect, a liquid supplying device for supplying a liquid from a liquid source to a cleaning device is provided. This liquid supplying device includes a flow rate control device configured to measure a flow rate of the liquid from the liquid source and control the flow rate based on the measured value, an IN-side pressure gauge provided between the liquid source and the flow rate control device and an OUT-side pressure gauge provided between the flow rate control device and the cleaning device.

According to the first aspect, it is possible to obtain a differential pressure between a pressure on the IN-side and a pressure on the OUT-side of the flow rate control device. Even when the flow rate control device cannot supply a desired flow rate, the operator can grasp whether the flow rate control device is malfunctioning or the differential pressure is insufficient by monitoring this differential pressure. When changing the flow rate control device in association with a change in the process recipe, it is possible to easily select an appropriate flow rate control device.

According to a second aspect, in the liquid supplying device according to the first aspect, the liquid source includes a dilution water supply source and a chemical supply source. The flow rate control device includes a dilution water flow rate control device configured to measure a flow rate of dilution water from the dilution water supply source and control the flow rate based on the measured value and a chemical flow rate control device configured to measure a flow rate of a chemical from the chemical supply source and control the flow rate based on the measured value. The liquid supplying device further includes a confluence part at which the dilution water from the dilution water flow rate control device and the chemical from the chemical flow rate control device join together. The IN-side pressure gauge includes a chemical IN-side pressure gauge provided between the chemical supply source and the chemical flow rate control device. The OUT-side pressure gauge is provided between the chemical flow rate control device or the dilution water flow rate control device and the cleaning device.

According to the second aspect, it is possible to measure an IN-side pressure of the chemical flow rate control device using the chemical IN-side pressure gauge. Since the dilution water from the dilution water flow rate control device and the chemical from the chemical flow rate control device join together at the confluence part, the pressure of the dilution water flowing out from the dilution water flow rate control device is equal to the pressure of the chemical flowing out from the chemical flow rate control device. Since the OUT-side pressure gauge is provided between the chemical flow rate control device or the dilution water flow rate control device and the cleaning device, it is possible to measure an OUT-side pressure of the chemical flow rate control device. It is thereby possible to acquire a differential pressure between the IN-side pressure and the OUT-side pressure of the chemical flow rate control device.

According to a third aspect, in the liquid supplying device according to the second aspect, the IN-side pressure gauge further includes a dilution water IN-side pressure gauge provided between the dilution water supply source and the dilution water flow rate control device.

According to the third aspect, the IN-side pressure of the dilution water flow rate control device can be measured. Since the OUT-side pressure of the dilution water flow rate control device can be measured using the OUT-side pressure gauge, it is possible to obtain a differential pressure between the IN-side pressure and the OUT-side pressure of the dilution water flow rate control device.

According to a fourth aspect, a liquid supplying method is provided for a liquid supplying device provided with a flow rate control device configured to measure a flow rate from a liquid source and control the flow rate based on the measured value, to supply a liquid from the liquid source to a cleaning device. This method includes a flow rate controlling step of measuring a flow rate from the liquid source and controlling the flow rate based on the measured value, a first measuring step of measuring a pressure of a liquid flowing into the flow rate control device, and a second measuring step of measuring a pressure of a liquid flowing out from the flow rate control device.

According to the fourth aspect, it is possible to obtain a differential pressure between a pressure on the IN-side and a pressure on the OUT-side of the flow rate control device. Even when the flow rate control device cannot supply a desired flow rate, the operator can grasp whether the flow rate control device is malfunctioning or the differential pressure is insufficient by monitoring this differential pressure. When changing the flow rate control device in association with a change in the process recipe, it is possible to easily select an appropriate flow rate control device.

According to a fifth aspect, in the liquid supplying method according to the fourth aspect, the flow rate control device includes a dilution water flow rate control device configured to measure a flow rate of dilution water from the dilution water supply source and control the flow rate based on the measured value and a chemical flow rate control device configured to measure a flow rate of a chemical from the chemical supply source and control the flow rate based on the measured value. The flow rate controlling step includes a dilution water flow rate controlling step of measuring a flow rate of the dilution water from the dilution water supply source and controlling the flow rate based on the measured value and a chemical flow rate controlling step of measuring a flow rate of the chemical from the chemical supply source and controlling the flow rate based on the measured value. The liquid supplying method further includes a step of joining the dilution water, a flow rate of which is controlled and the chemical, a flow rate of which is controlled. The first measuring step includes a step of measuring a pressure of a chemical flowing into the chemical flow rate control device. The second measuring step includes a step of measuring a pressure of any one of the chemical flowing out from the chemical flow rate control device, the dilution water flowing out from the dilution water flow rate control device and a mixed solution of the chemical and the dilution water.

According to the fifth aspect, it is possible to measure an IN-side pressure of the chemical flow rate control device. Furthermore, since the dilution water and the chemical join together, the pressure of the dilution water flowing out from the dilution water flow rate control device is equal to the pressure of the chemical flowing out from the chemical flow rate control device. It is therefore possible to measure an OUT-side pressure of the chemical flow rate control device by measuring a pressure of any one of the chemical flowing out from the chemical flow rate control device, dilution water flowing out from the dilution water flow rate control device and a mixed solution of the chemical and the dilution water. It is thereby possible to acquire a differential pressure between the IN-side pressure and the OUT-side pressure of the chemical flow rate control device.

According to a sixth aspect, in the liquid supplying method according to the fifth aspect, the first measuring step includes a step of measuring a pressure of the dilution water flowing into the dilution water flow rate control device.

According to the sixth aspect, the IN-side pressure of the dilution water flow rate control device can be measured. Since the OUT-side pressure of the dilution water flow rate control device is measured in the second measuring step, it is possible to obtain a differential pressure between the IN-side pressure and the OUT-side pressure of the dilution water flow rate control device.

REFERENCE SIGNS LIST

10 . . . DIW supply source
20 . . . First chemical supply source
30 . . . Second chemical supply source 52 . . . Pressure gauge
62 . . . Pressure gauge
74 . . . Pressure gauge
75 . . . Pressure gauge
76 . . . Pressure gauge
78 . . . Confluence part
79 . . . Confluence part
100 . . . Chemical supplying device
111 . . . CLC
121 . . . CLC
131 . . . CLC
200 . . . Cleaning device

What is claimed is:

1. A device for generating a mixed liquid by mixing a liquid from a first liquid source and a liquid from a second liquid source, comprising:
   a flow rate control device configured to measure a flow rate of a liquid from the first liquid source and control the flow rate based on the measured value;
   an IN-side pressure gauge provided between the first liquid source and the flow rate control device; and
   an OUT-side pressure gauge provided at downstream side of the flow rate control device, wherein a confluence part that is a point of confluence where the liquid from the first liquid source and the liquid from the second liquid source joint together is provided between the OUT-side pressure gauge and the flow rate control device.

2. The device according to claim 1, further comprising a first chemical CLC box,
   wherein the flow rate control device is housed in the first chemical CLC box.

3. The device according to claim 1, further comprising a chemical utility box,
   wherein the IN-side pressure gauge is housed in the chemical utility box.

4. The device according to claim 3,
   wherein the OUT-side pressure gauge is provided outside of the chemical utility box.

5. The device according to claim 1,
   wherein the device is configured to supply the mixed liquid to a cleaning device that cleans a substrate.

6. A liquid supplying device, comprising:
   a housing,
   a DIWCLC box housed in the housing, the DIWCLC box suppling a DIW supplied from a DIW supply source through an IN-side pressure gauge configured to measure a pressure of the DIW to a first pipe connected to a discharge side of the DIWCLC box, and comprising a flow rate control device configured to control a flow rate of the DIW inside the pipe housed therein,
   a first chemical CLC box housed in the housing, the first chemical CLC box supplying a first chemical supplied from a first chemical supply source to a second pipe and controlling a flow rate of the first chemical,
   a confluence part housed in the housing, the confluence part being a point of confluence where the first pipe and the second pipe joint together,
   an OUT-side pressure gauge housed in the housing and configured to measure a pressure of a mixed liquid generated by mixing the DIW and the first chemical at the confluence part, and
   a third pipe housed in the housing and configured to discharge the mixed liquid that has been passed through the OUT-side pressure gauge to outside of the housing.

7. A liquid supplying device, comprising:
   a chemical utility box comprising an IN-side pressure gauge that measures a pressure of a chemical supplied from a chemical supply source,
   a chemical CLC box comprising a first flow rate control device configured to control a flow rate of the chemical, and connected to downstream side of the chemical utility box,
   a chemical discharge pipe connected to downstream side of the chemical CLC box,
   a DIWCLC box comprising a second flow rate control device configured to control a flow rate of a DIW supplied from a DIW supply source,
   a DIW discharge pipe connected to downstream side of the DIW CLC box,
   a confluence part that is a point of confluence where the chemical discharge pipe and the DIW discharge pipe joint together,
   an OUT-side pressure gauge configured to measure a pressure of a mixed liquid generate by mixing the DIW and the first chemical at the confluence part, and
   a discharge pipe connected to the OUT-side pressure gauge.

* * * * *